United States Patent
Osborne et al.

(12) 
(10) Patent No.: US 6,222,249 B1
(45) Date of Patent: Apr. 24, 2001

(54) SEMICONDUCTOR DEVICE

(75) Inventors: Peter H Osborne, Swindon; Martin C. Wilson, Cricklade, both of (GB)

(73) Assignee: Mitel Semiconductor Limited (GB)

( * ) Notice: Subject to any disclaimer, the term of this patent is extended or adjusted under 35 U.S.C. 154(b) by 0 days.

(21) Appl. No.: 09/339,700

(22) Filed: Jun. 24, 1999

(30) Foreign Application Priority Data

Jun. 26, 1998 (GB) .................................................. 9813926

(51) Int. Cl.$^7$ ....................... H01L 27/082; H01L 27/102; H01L 29/70
(52) U.S. Cl. ............................................. 257/571; 257/572
(58) Field of Search ..................................... 257/571, 572

(56) References Cited

FOREIGN PATENT DOCUMENTS 0 089 504 A2    9/1983   (EP) .

Primary Examiner—Stephen D. Meier
(74) Attorney, Agent, or Firm—Kirschstein, et al.

(57) ABSTRACT

A number of npn and pnp bipolar transistors is formed in a single chip of silicon, so that some of the transistors have a greater frequency response than others. The higher frequency transistors have their emitters located closer to the collectors, by positioning a collector, or emitter, of a transistor in a recessed portion of the surface of the chip. The recess is formed in an accurate and controlled manner by locally oxidizing the silicon surface, and subsequently removing the oxide to leave the recess.

6 Claims, 3 Drawing Sheets

US 6,222,249 B1

SEMICONDUCTOR DEVICE

FIELD OF THE INVENTION

This invention relates to semiconductor devices and is particularly applicable to bipolar devices.

BACKGROUND TO THE INVENTION

It is common to provide a large number of bipolar transistors on a silicon chip, but it is often desired that the bipolar transistors have different operating characteristics, some having a higher frequency performance and some having a higher reverse bias capability for example.

It has proved difficult selectively to adjust the characteristics of different transistors when they are manufactured on a single chip, and the present invention seeks to provide an improved semiconductor device.

SUMMARY OF THE INVENTION

According to this invention, a semiconductor device includes a plurality of bipolar transistors formed in a body of silicon, each transistor having a collector and an emitter with a base region positioned therebetween, the transistors having a collector or an emitter lying in a common plane buried within said body, at least one transistor of which has its emitter or collector positioned at an outer planar surface of said body, and at least one transistor of which has its emitter or collector positioned in a recess below said planar surface, said recess being formed by local sacrificial oxidation of the silicon.

Preferably, the body of silicon comprises a silicon substrate carrying a silicon epitaxial layer, in which case the buried plane is at the interface between the substrate and the epitaxial layer.

The body of silicon is not wholly silicon as it contains dopants which act as conductivity modifiers, and may contain small quantities of a lattice modifier such as germanium.

The bipolar transistors may be all pnp or npn, but said body of silicon may contain both pnp and npn transistors, ie it is a so-called complementary device.

The device of the present invention may be fabricated by forming the recess by local sacrificial oxidation of the silicon.

Preferably, the base region is contiguous with whichever of the emitter or collector is positioned at the surface of the silicon body.

The collector or emitter which is positioned at said common plane is preferably formed in a region at which conductivity modifying dopants are introduced into the surface of the silicon substrate surface prior to the growth of the epitaxial layer. During growth of the epitaxial layer the buried collector or emitter, as the case may be, will diffuse into the epitaxial laser, but preferably does not extend to the base region, so that the base region is separated from the buried collector or emitter by a region of epitaxial silicon, which is lightly doped so as to be conductive but with a high resistivity.

DETAILED DESCRIPTION OF THE PREFERRED EMBODIMENT

Figure 1:
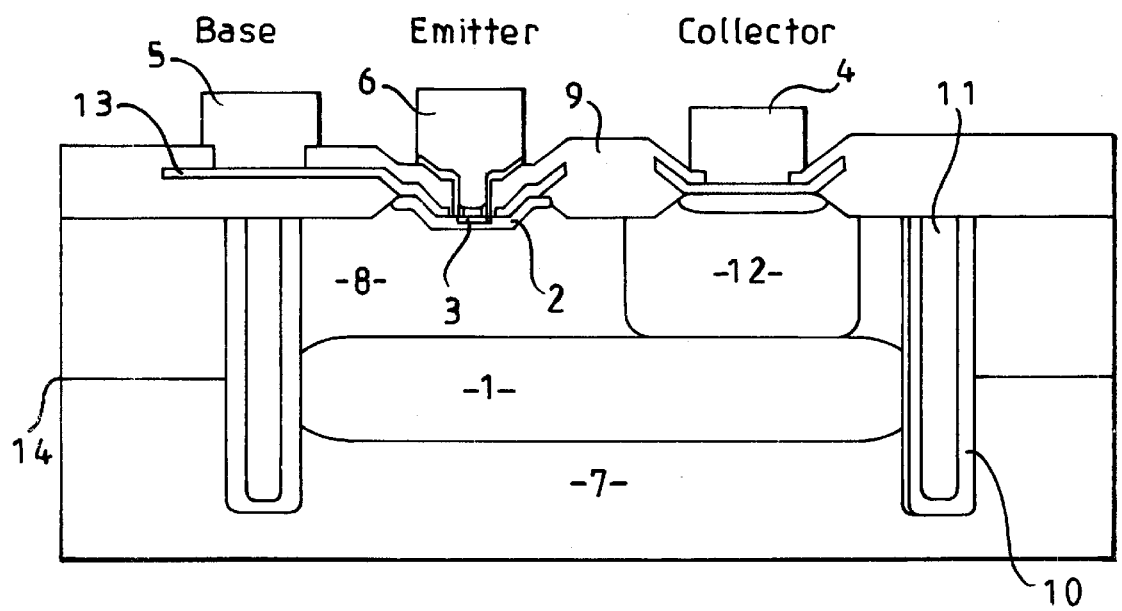
FIG. 1 shows diagrammatically an npn transistor in accordance with the invention.

Referring to FIG. 1, there is shown therein a sectional view through that part of a silicon wafer having a bipolar npn transistor. In practice, the wafer will be large, and only a small part of it is shown. The wafer typically carries many electrical circuits, and after completion of the silicon processing steps is divided into individual small chips, each of which typically contains several thousand bipolar transistors, both pnp and npn– chips which contain both types of transistor are generally referred to as complementary bipolar devices. Thus, FIG. 1 shows only that small part of a chip carrying a single npn transistor having a recessed emitter, those other transistors having the emitter or collector at a planar surface of the chip not being shown.

The npn transistor comprises a collector 1, a base 2 and an emitter 3, each of which has an associated collector electrode 4, base electrode 5 and emitter electrode 6 respectively. The collector 1 is positioned on a silicon substrate 7 of p– type, and the collector 1 is of n type. This n type region is formed in the substrate 7 by the introduction of conductivity modifying dopants, after which an epitaxial layer 8 is grown onto the substrate 7. During this stage, the dopant also diffuses further into the substrate and also into the epitaxial layer as it is being grown. The epitaxial growth is n– type as its dopant concentration is substantially less than that of the collector 1. The interface 14 between the substrate 7 and the epitaxial layer 8 is thus buried within the finished device and lies in a plane common to all transistors on a wafer. The epitaxial layer 8 has an upper planar surface which extends across the surface of the wafer.

The base 2 is formed above the epitaxial layer by the introduction of appropriate dopants to form a p+ region. The emitter 3, which occupies a very small area, is formed above the base region by subsequent diffusion to form an n region and is located at the bottom of a recess in the top planar surface. As is customary, the electrodes are separated electrically from those areas of the silicon to which contact is not required by means of a silicon dioxide layer 9. The electrodes are connected to the appropriate regions of silicon by a selectively etched metallisation layer 13, in conventional manner, to form separate electrical tracks as required. The collector 1 is connected to the collector electrode 4 by a further, more highly doped, n region 12. Each transistor is surrounded by an insulating trench to electrically separate it from adjacent transistors. The trench comprises a wall coating of silicon oxide 10, and a trench filling of polysilicon 11.

It will be observed that the collector 1 is spaced apart from the base 2 by an intervening region of epitaxial n– type silicon. This spacing greatly affects the performance of the transistor; a shorter distance between base and collector gives improved high frequency response, but with lower reverse breakdown voltage. Thus, only those performance critical transistors requiring a high frequency response typically will be manufactured with the recessed emitter giving reduced spacing between base and collector, the remaining transistors having their emitters formed at the outer planar surface of the epitaxial layer so as to give a higher operating voltage capability.

Figure 2:
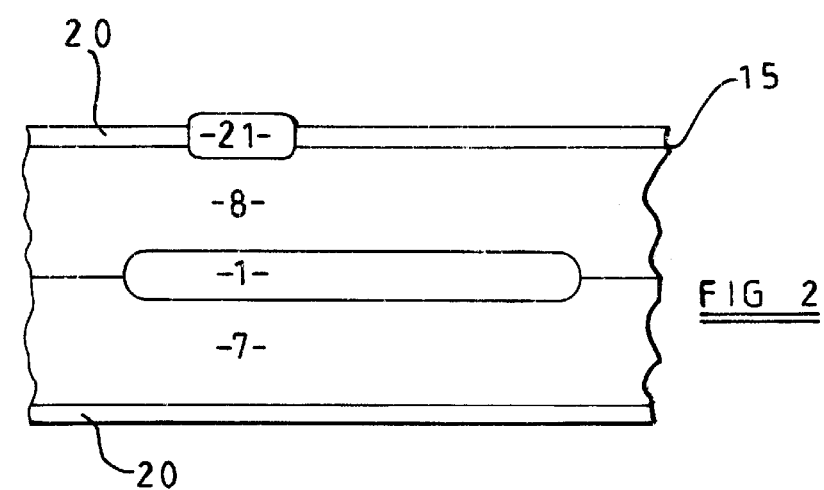
FIGS. 2 and 3 show stages in the manufacture of that transistor.
Figure 3:
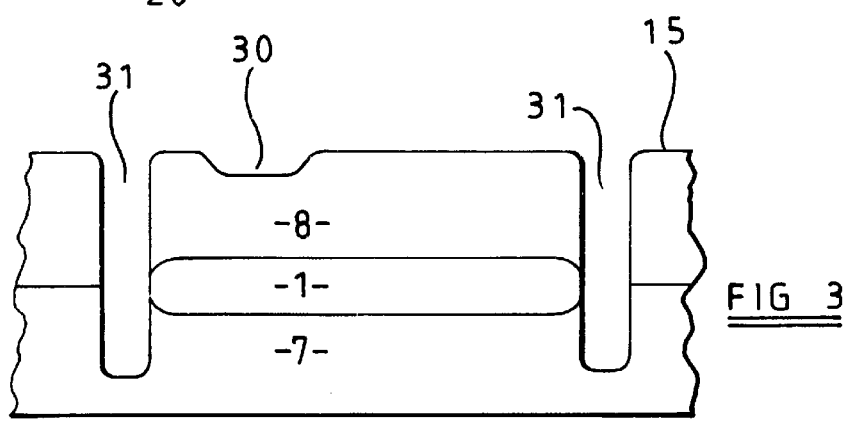

The key steps in the manufacture of the bipolar transistor are shown in FIGS. 2 and 3. Referring to FIG. 2, some of the processing steps, which are conventional, having already been performed. Thus, the collector 1 has been formed and the epitaxial layer 8 has been grown on the substrate 7 to give an upper planar surface. A thin uniform layer 20 of silicon dioxide is grown on all surfaces of the silicon, and then using silicon nitride as a mask, a thicker oxide 21 is grown at a localised region—this layer is much thicker than layer 20, and as is known, the oxide so formed extends both above and below the silicon surface which is subject to the oxidising atmosphere. Such oxides are readily produced by exposing the wafer to oxygen at an elevated temperature. Thus, the oxide inevitably consumes some of the surface silicon, but this is done at a predictable and controllable rate, so that over most of the wafer there is an upper planar surface 15.

The formation of the oxide therefore produces a recess 30 in the planar surface 15 of the silicon, and this is shown in FIG. 3 after removal of the silicon dioxide as the silicon dioxide can readily be removed without damaging the underlying silicon surface. It will be appreciated that the thicker oxide itself plays no part in the final device, it being used in a sacrificial mode to permit accurate and reliable control of the area and depth of the recess 30. The same figure shows the formation of the isolation trenches 31 which are deep recesses formed by an anisotropic etch—such etching processes are well known and do not form part of the invention.

Thus, the technique of producing a recess in the surface of the silicon by sacrificial oxidation not only enables the depth of the recess to be precisely controlled, but even more importantly, the spacing between the bottom of the recess and the top of the collector can be accurately controlled to predetermined values, typically less than 1 micron.

Figure 4:
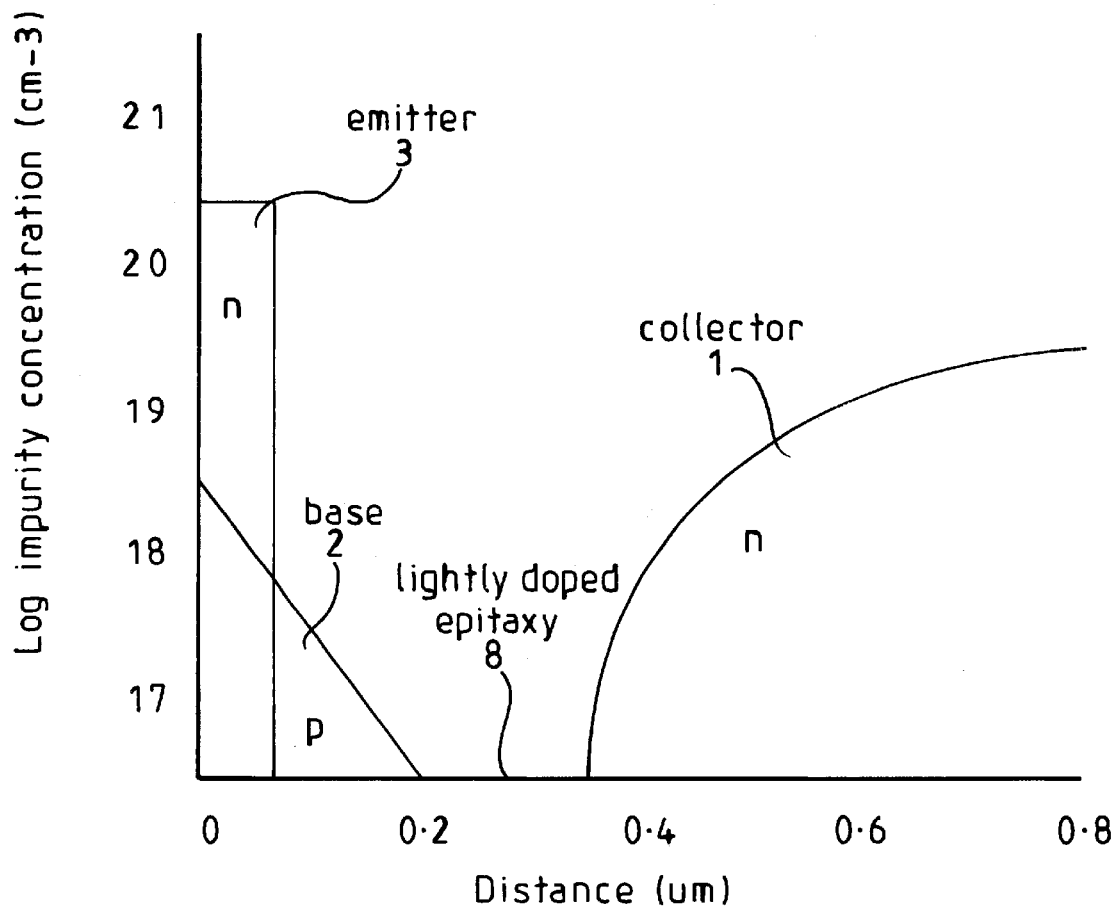
FIG. 4 is an explanatory diagram.

FIG. 4 shows diagrammatically the dopant profile from the collector to emitter of the device shown in FIG. 1. It will be seen that the p base 2 is contiguous with the n emitter 3, and that the collector 1 is spaced apart from the base by the intervening epitaxial silicon, which is relatively lightly doped and so has a low conductivity. This means that when the npn transistor is reverse biassed, a potential develops across this epitaxial region 8 which improves the voltage breakdown characteristic. However, in the forward biassed conductive state, the charge carriers largely pass through this epitaxial region into the collector region before recombination takes place. The length of the path through the epitaxial region therefore strongly affects the frequency response of the transistor, and for very high frequency operation, this distance should be short.

By means of the sacrificial oxidation process to selectively reduce the thickness of this intervening epitaxial region by producing a recess in the planar surface of the semiconductor material, the thickness of the epitaxial region can very substantially be reduced in a precisely controlled manner.

Figure 5:
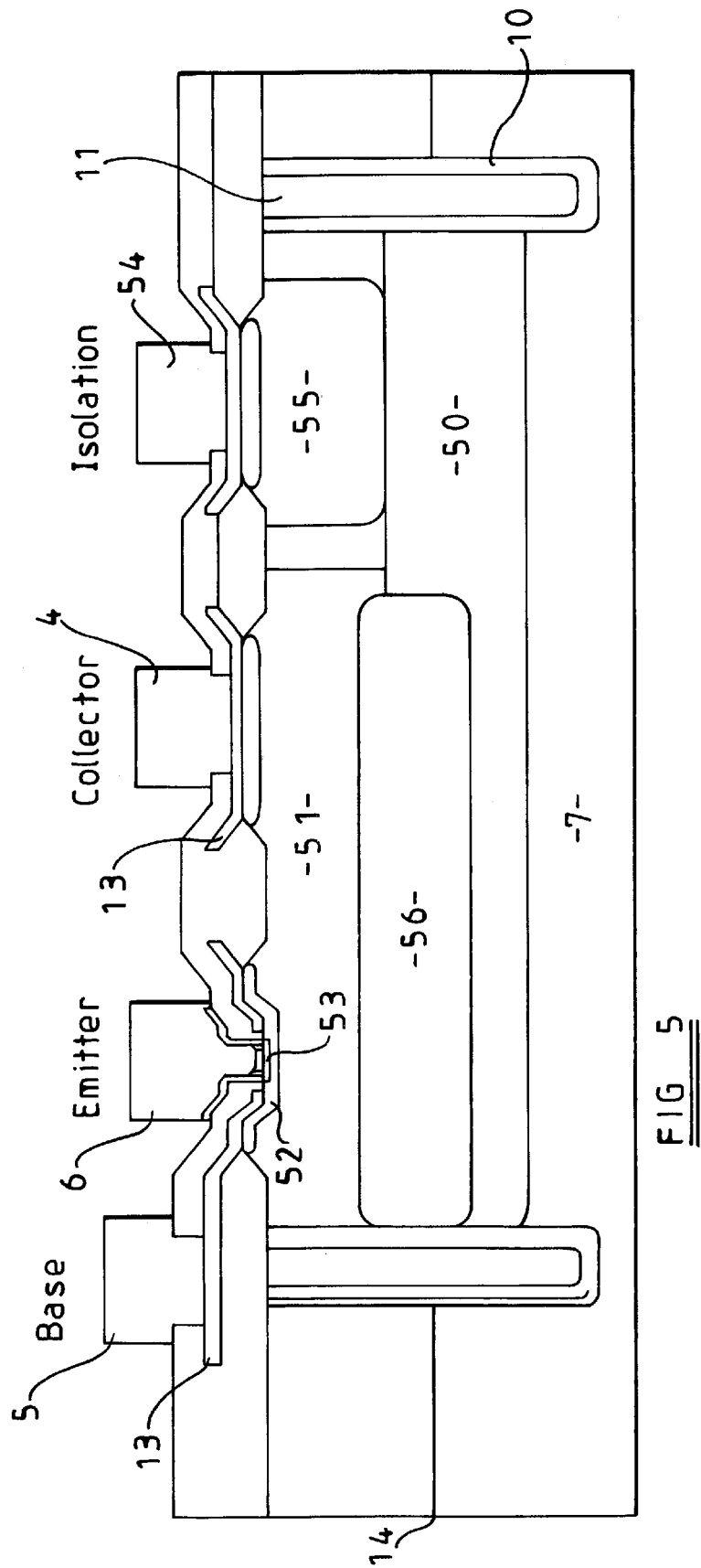
FIG. 5 shows diagrammatically a pnp transistor in accordance with the invention.

The invention is also applicable to pnp transistors, and an example is shown in FIG. 5.

This figure is very similar to FIG. 1, but it has an additional buried n type substrate 50 to isolate the pnp transistor from the substrate 7. The pnp transistor is located within the region of a lightly doped p- region 51, which is a doped region of the epitaxial layer. The n base 52 is located above this p- region 51, and a small p emitter 53 is located above that. The p collector 56 is located at the bottom of the p- region 51 as shown.

To improve electrical isolation, the buried n substrate is linked to an isolation electrode 54 by a heavily doped n region 55, and in operation an isolation bias potential is applied to the electrode 54. Remaining parts of FIG. 5 are similar to those of FIG. 1 and bear the same reference numerals.

In practice, as previously mentioned, each semiconductor chip will typically carry a large number of bipolar transistors, only some of which will be in accordance with FIG. 1 or FIG. 5, the remainder having the emitter (or collector as the case may be) being formed at the planar surface of the wafer, and not in a recess. Although both FIGS. 1 and 2 show the collector being buried within the wafer at the boundary between the silicon substrate and the epitaxial layer, and the emitter at the surface, the reverse configuration is also possible.

A particular benefit of the invention, is that the manufacture of the base region, and the region above it, ie emitter or collector, is the same for all bipolar transistors on a wafer, so that operating characteristics, such as forward current gain, are the same for all transistors, except those which specifically depend on the emitter-collector spacing.

What is claimed is:

1. A semiconductor device including a plurality of bipolar transistors formed in a body of silicon, each transistor having a collector and an emitter with a base region positioned therebetween, the transistors having a collector or an emitter lying in a common plane buried within said body, at least one transistor of which has its emitter or collector positioned at an outer planar surface of said body, and at least one transistor of which has its emitter or collector positioned in a recess below said planar surface, said recess being formed by local sacrificial oxidation of the silicon, and wherein the widths of the base regions of the transistors are substantially identical.

2. A device as claimed in claim 1 and wherein the body of silicon comprises a silicon substrate carrying an epitaxial layer.

3. A device as claimed in claim 1 and wherein said body contains both pnp and npn transistors.

4. A device as claimed in claim 1 and wherein all of said transistors are arranged to have an emitter at the surface of the silicon body, and a collector buried at said interface.

5. A device as claimed in claim 1 and wherein the base region is contiguous with whichever of the emitter or collector is positioned at the surface of the silicon body.

6. A device as claimed in claim 1 and wherein the buried emitter or collector is spaced apart from the base by a region of lightly doped epitaxial silicon.

* * * * *